(12) United States Patent
Koveshnikov et al.

(10) Patent No.: US 6,630,363 B2
(45) Date of Patent: Oct. 7, 2003

(54) METHOD FOR EVALUATING IMPURITY CONCENTRATIONS IN UNPOLISHED WAFERS GROWN BY THE CZOCHRALSKI METHOD

(75) Inventors: Sergei V. Koveshnikov, Vancouver, WA (US); Douglas G. Anderson, Vancouver, WA (US)

(73) Assignee: SEH America, Inc., Vancouver, WA (US)

( * ) Notice: Subject to any disclaimer, the term of this patent is extended or adjusted under 35 U.S.C. 154(b) by 100 days.

(21) Appl. No.: 10/004,065

(22) Filed: Nov. 14, 2001

(65) Prior Publication Data

US 2002/0098601 A1 Jul. 25, 2002

Related U.S. Application Data

(63) Continuation-in-part of application No. 09/544,197, filed on Apr. 6, 2000.

(51) Int. Cl.[7] .............................................. H01L 21/66
(52) U.S. Cl. ......................... 438/14; 438/16; 438/471; 438/476
(58) Field of Search ........................... 438/14, 16, 476, 438/471

(56) References Cited

U.S. PATENT DOCUMENTS 5,233,191 A 8/1993 Noguchi et al.
6,174,740 B1 1/2001 Ohta et al.

FOREIGN PATENT DOCUMENTS

JP 2001196433 * 7/2001 ........... H01L/21/66

OTHER PUBLICATIONS

Wolf, S. and Tauber, R.N., "Silicon Processing for the VLSI Era", vol. 1, pp. 5, 8 and 21, 1986.*

* cited by examiner

*Primary Examiner*—Amir Zarabian
*Assistant Examiner*—Christy Novacek
(74) *Attorney, Agent, or Firm*—Douglas G. Anderson

(57) ABSTRACT

A method for evaluating the concentration of impurities in as-grown monocrystalline semiconductor ingots is provided. The method includes growing a monocrystalline semiconductor ingot, and measuring the bulk impurity levels of the ingot by drawing together at least a portion of the impurities and measuring the concentration of impurities that were drawn together. In one embodiment of the invention, a gettering layer is formed adjacent one or more surfaces of a sample of the monocrystalline semiconductor ingot to getter impurities from the sample into the gettering layer. The impurity concentration of the gettering layer is then measured and the results are used to determine at least a range of impurity concentrations that were grown into the monocrystalline semiconductor ingot.

9 Claims, 1 Drawing Sheet

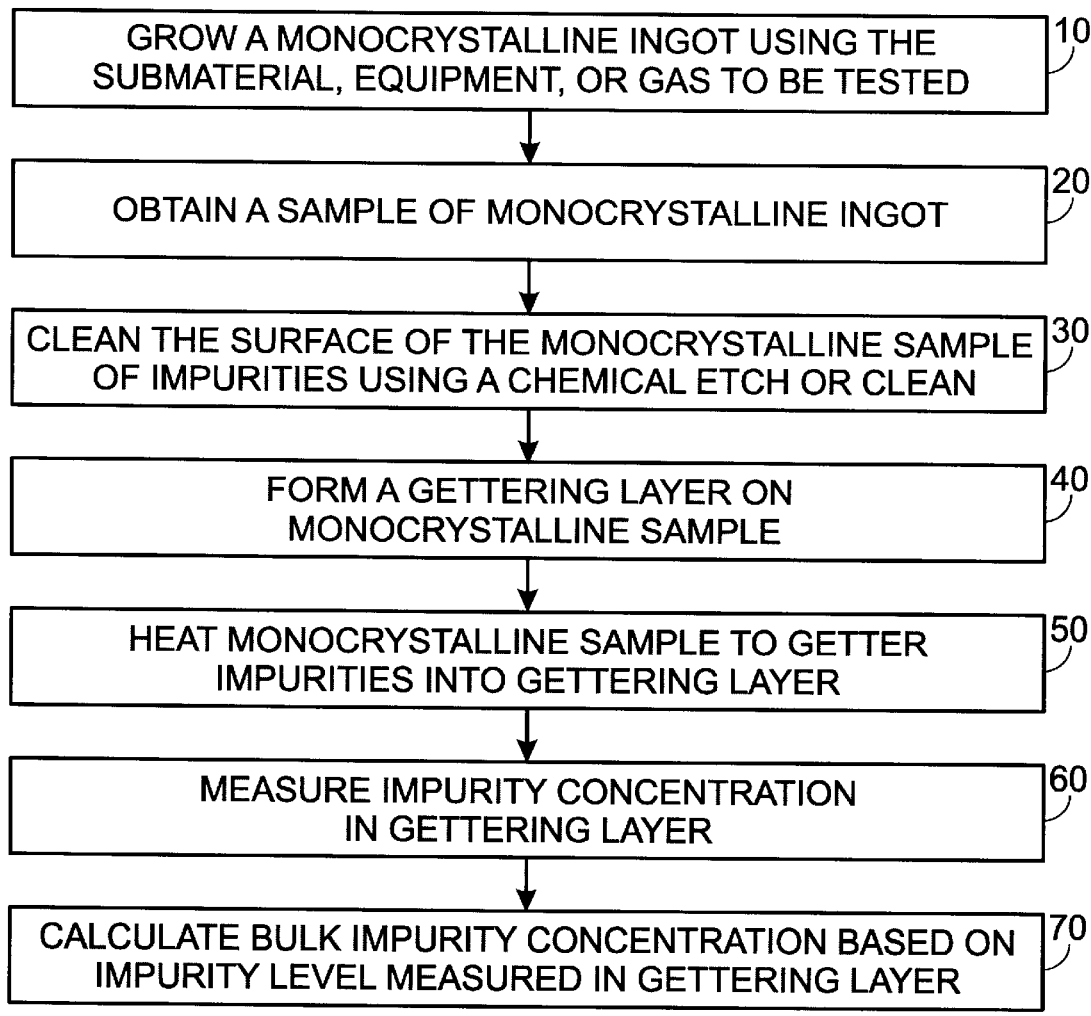

METHOD FOR EVALUATING IMPURITY CONCENTRATIONS IN UNPOLISHED WAFERS GROWN BY THE CZOCHRALSKI METHOD

REFERENCE TO RELATED APPLICATIONS

The present application is a continuation-in-part of U.S. application Ser. No. 09/544,197 filed Apr. 6, 2000, the contents of which are hereby incorporated by reference in their entirety.

TECHNICAL FIELD

The present invention relates to semiconductor processing, and more particularly to measuring impurity concentrations of polycrystalline silicon material used as the starting material for growing monocrystalline silicon ingots using the Czochralski (CZ) method.

BACKGROUND OF THE INVENTION

Manufacturers of semiconductor integrated circuits are constantly striving to increase the performance and reduce the price of their products. One way to both increase the performance and reduce the price of an integrated circuit is to reduce the size of the integrated circuit. By reducing the size of a circuit, more circuits can be manufactured on a single semiconductor substrate, thereby reducing the unit cost of the circuit. In addition, reducing the size of a circuit typically increases its speed and reduces its power consumption.

One problem manufacturers encounter in attempting to reduce the size of their integrated circuits involves impurity contamination. For example, metallic contamination of a semiconductor substrate can cause excess leakage currents, poor voltage breakdown characteristics, and reduced minority carrier lifetimes. As the size of an integrated circuit decreases, the detrimental effect of impurities in the semiconductor is magnified. For extremely small circuits, even relatively low levels of contamination can be sufficient to render the circuit inoperative. Therefore, manufacturers take extraordinary measures to prevent impurity contamination in their manufacturing processes.

To optimize their contamination control practices, manufacturers often need to measure the concentration of impurities in their semiconductor substrates at various points during the manufacturing process. This allows manufacturers to determine which area(s) of their process are causing impurity contamination problems. However, as the levels of impurity concentration have decreased to very low levels, it has become more and more difficult to measure the impurity concentration. Indeed, semiconductor industry standards such as the National Semiconductor Roadmap call for impurity concentrations to be as low as $10^{10}$ cm$^{-3}$ in the near future. Since the atomic density of a typical semiconductor substrate such as silicon is approximately $10^{22}$ cm$^{-3}$, impurity concentrations of $10^{10}$ cm$^{-3}$ can be very difficult to measure even with sophisticated measurement equipment.

For example, copper (Cu) and nickel (Ni) are two metallic impurities found in semiconductor substrates. Impurity concentrations of copper and nickel in heavily boron-doped substrates typically are measured by techniques such as Total Reflection X-Ray Fluorescence (TXRF) and Secondary Ion Mass Spectroscopy (SIMS), etc. The minimum detection limit of copper is approximately $10^{17}$ cm$^{-3}$ by TXRF (measured near the surface of the substrate) and approximately $10^{15}$ cm$^{-3}$ by SIMS. As a result, manufacturers have begun to search for new ways to measure impurity concentrations in semiconductor substrates.

As acceptable levels of metallic impurities are continually being reduced and new methods for measuring impurity concentrations are developed, manufacturers must understand and control the impurity concentrations of processes used to manufacture semiconductor substrates.

One such area of concern is the initial polycrystalline silicon used to be formed into monocrystalline silicon ingots by the Czochralski (CZ) or Float Zone (FZ) methods.

SUMMARY OF THE INVENTION

The Invention provides a method for evaluating the concentration of impurities within a semiconductor crystal grown using either the Czochralski or the Float Zone technique.

In one embodiment of the invention, a gettering layer is formed on one surface of the moncrystalline sample to getter impurities that have been transferred from the polycrystalline submaterials and crystal pulling equipment to the monocrystalline sample. The impurity concentration of the gettering layer is then measured and the results are used to determine at least a range of impurity concentrations contained within the sample grown.

BRIEF DESCRIPTION OF THE DRAWING

FIG. 1 is a flowchart illustrating a method of evaluating the concentration of impurities in an as-grown crystal according to the present invention.

DETAILED DESCRIPTION OF THE INVENTION

A general crystal growing process includes placing a quantity of polycrystalline submaterial pieces, such as polycrystalline silicon, into a crucible. The crucible containing the polycrystalline submaterial is then heated until it becomes a molten liquid. A monocrystalline seed containing the desired crystalline structure and orientation is then dipped into the molten liquid, and slowly extracted. As the monocrystalline seed is extracted, the molten material will adhere to the bottom of the seed such that the molten material will be extracted and cooled, thereby "growing" a monocrystalline ingot. Many techniques have been employed to improve specific ingot parameters, such as varying the speed of extraction, rotation of the crucible and seed, application of a magnetic field to the molten liquid, flowing various process gases through the pulling apparatus, varying the cooling speed of the ingot being grown, etc. Any of the equipment used to grow the monocrystalline ingot, the process gases, or the polycrystalline submaterial itself can contribute impurities to the resultant monocrystalline ingot.

After the monocrystalline ingot is grown, it is allowed to cool. It is then ground into a cylindrical shape, and the conical ends are removed. According to the present invention, a sample portion (a wafer or slug) is sliced from the ingot for sampling. Both the grinding and slicing processes are performed at approximately room temperature. Since both the grinding and slicing process are "dirty" in that they use metal equipment that contacts the surface of the sample to be tested, the surface of the sample must be chemically cleaned. The surface metals can effectively be removed without causing further contamination due to the fact that the temperature remains low enough during these processes to prevent diffusion of the metal impurities into the body of the sample.

After the surface has been chemically cleaned of impurities, the sample is then subjected to a process to form a gettering layer on at least one surface. A typical manner for forming such a gettering layer is by low-pressure chemical vapor deposition (LPCVD) of polycrystalline silicon.

To ensure the diffusion of impurities contained within the sample into the gettering layer, the sample may then be heated or annealed. For example, the sample may be annealed in the range of 600° C. to 900° C. for one hour, followed by a slow cool down to approximately 400° to 500° C. The slow cool down allows sufficient time for the impurities contained within the sample bulk to diffuse to the gettering layer.

The gettering layer can then be analyzed by techniques such as Total Reflection X-Ray Flourescense (TXRF) and/or Secondary Ion Mass Spectroscopy (SIMS) using the techniques outlined in co-pending Application Number 09/544,197.

After measuring the concentration of the localized impurities $N_L$ found in the gettering layer using TXRF methods or the like, the concentration of bulk impurities $N_B$ originally found in the sample can be found from:

$$N_B = \frac{N_L * T_{layer}}{T_{substrate}}$$

Wherein $T_{substrate}$ is the thickness of the sample and $T_{laer}$ is the thickness of the gettering layer, considering substantially all impurities are drawn into the gettering layer. Determination of appropriate actions can then be made.

An exemplary method for evaluating the impurity concentrations in a monocrystalline ingot is indicated generally in FIG. 1. The method includes, at 10, growing a monocrystalline semiconductor substrate using a CZ or FZ process. In one embodiment of this example, one component such as a component, gas, or polycrystalline submaterial to be used in the crystal growth has an unknown impurity level, and all other elements used have known impurity levels. This embodiment can be used to determine the level of impurities in that one unknown element, and is particularly useful for qualifying new equipment, gases, or submaterials.

In another embodiment the impurity levels are not known on any component, wherein the impurity levels of the overall process can be checked. This embodiment is particularly useful as a quality control method of maintaining a process that is statistically within control limits.

As shown at 20, a portion of the monocrystalline ingot is then taken for analysis. Typically this involves mechanical machining such as grinding or slicing to remove a representative sample. The sample is then cleaned using any chemical cleaning that will remove impurities caused by the machining process, such as an acid etch, as indicated at 30. As shown in 40, A gettering layer is then formed on at least one surface of the sample. It is preferred to form a gettering layer on one surface only, such that all impurities will be gettered into that one layer. If a gettering layer is formed on each surface, the impurities will be substantially equally divided between the two layers which will reduce the sensitivity of the analysis. It is also preferred that the gettering layer be a polycrystalline layer deposited on the sample. Polycrystalline gettering layer getters through a process known as segregation gettering which utilizes the difference in solubility between monocrystalline and polycrystalline materials to diffuse impurities. The solubility limit in polycrystalline material is much higher than that of monocrystalline material, and as such impurities migrate toward the area of higher solubility. A polycrystalline gettering layer is also preferred over mechanical damage method of gettering, known as relaxation gettering, because relaxation gettering requires supersaturation of impurities to getter at the created defects. When the impurity levels are below the supersaturation level of the semiconductor material, very little gettering is accomplished, and the supersaturation levels are typically much higher than the allowable levels impacting device quality.

The sample is then annealed to promote gettering of the impurities into the gettering layer, as indicated in 50. The impurity concentration in the gettering layer is then measured by suitable means, as indicated at 60. Based on the impurity concentration in the gettering layer, the bulk impurity concentration may be calculated using the equation presented above, as indicated in 70.

Other embodiments of the present invention will be apparent to those skilled in the art from a consideration of this specification or practice of the invention disclosed herein. It is intended that the specification be considered in all aspects as illustrative, and not restrictive. The scope of the invention is, therefore, indicated by the appended claims rather than by the forgoing description. All changes which come within the meaning and range of the equivalence of the claims are to be embraced within their scope.

What is claimed is:

1. A method of evaluating the concentration of impurities in as-grown monocrystalline semiconductor ingots, the method comprising:

growing a monocrystalline ingot;

extracting a portion of the monocrystalline ingot as a sample;

drawing together a at least a portion of the impurities in the sample; and measuring the concentration of the impurities that were drawn together, wherein the drawing together at least a portion of the impurities in the sample includes heating the sample to a temperature greater than 600° C. for at least one minute, and then cooling the sample to between 400° C. and 500° C. to allow the impurities to be drawn together.

2. The method of claim 1, wherein the drawing together includes drawing together a portion of the impurities to one or more regions adjacent a surface of the sample.

3. The method of claim 1, wherein the drawing together includes gettering.

4. The method of claim 3, wherein the drawing together includes forming a gettering layer adjacent a surface of the sample and gettering a portion of the impurities to the gettering layer.

5. The method of claim 4, wherein the measuring includes measuring the concentration of the impurities in the gettering layer.

6. The method of claim 4, wherein the gettering layer is a polysilicon layer.

7. The method of claim 1, further comprising using the results of the measuring to determine at least a range of concentrations of impurities that were in the monocrystalline ingot prior to being drawn together.

8. The method of claim 4, wherein the drawing together includes gettering substantially all of the impurities in the sample to the one or more gettering layers.

9. The method of claim 1, wherein the impurities include at least one of copper or nickel.

* * * * *